United States Patent [19]

Mito et al.

[11] Patent Number: 5,345,392
[45] Date of Patent: Sep. 6, 1994

[54] BATTERY CHARGE MONITOR FOR A PERSONAL COMPUTER

[75] Inventors: Toshitsugu Mito, Kanagawa, Japan; Leopoldo L. Suarez, Bota Raton, Fla.; Shaun Astarabadi, Irvine; Marcus G. Calescibetta, Mission Viejo, both of Calif.

[73] Assignee: International Business Machines Corporation, Armonk, N.Y.

[21] Appl. No.: 647,120

[22] Filed: Jan. 25, 1991

[51] Int. Cl.$^5$ ............................ G06F 15/20; H02J 7/04
[52] U.S. Cl. ...................................... 364/483; 324/431; 340/636; 364/481
[58] Field of Search ......................... 364/481, 483, 550; 320/39, 43, 48, 21, 44, 40; 324/427, 429, 431, 433; 340/636

[56] References Cited
U.S. PATENT DOCUMENTS

| | | | |
|---|---|---|---|
| 4,194,146 | 3/1980 | Patry et al. | 320/44 |
| 4,289,836 | 9/1981 | Lemelson | 429/61 |
| 4,333,149 | 6/1982 | Taylor et al. | 364/481 |
| 4,377,787 | 3/1983 | Kikuoka et al. | 324/431 |
| 4,423,379 | 12/1983 | Jacobs et al. | 324/429 |
| 4,455,523 | 6/1984 | Koenck | 320/43 |
| 4,460,870 | 7/1984 | Finger | 324/429 |
| 4,553,081 | 11/1985 | Koenck | 320/43 |
| 4,558,281 | 12/1985 | Codd et al. | 324/433 |
| 4,709,202 | 11/1987 | Koenck et al. | 320/43 |
| 4,724,528 | 2/1988 | Eaton | 320/43 X |
| 4,725,784 | 2/1988 | Peled et al. | 324/427 |
| 4,737,702 | 4/1988 | Koenck | 320/40 |
| 4,775,827 | 10/1988 | Ijntema | 320/48 X |
| 4,885,523 | 12/1989 | Koenck | 320/21 |
| 4,947,123 | 8/1990 | Minezawa | 324/427 |
| 4,961,043 | 10/1990 | Koenck | 320/21 |
| 4,965,738 | 10/1990 | Bauer et al. | 364/550 X |
| 5,047,961 | 9/1991 | Simonsen | 364/550 |
| 5,055,763 | 10/1991 | Johnson et al. | 320/39 X |

Primary Examiner—Kevin J. Teska
Attorney, Agent, or Firm—Martin J. McKinley

[57] ABSTRACT

A charge monitor for a battery operated computer includes a processor electrically connected to a plurality of signal generating circuits. The generated signals represent the temperature, voltage and current characteristics of the battery being monitored. The level of remaining battery energy is ascertained by utilizing a predetermined discharge table which is dependent upon the battery temperature, voltage and current.

5 Claims, 14 Drawing Sheets

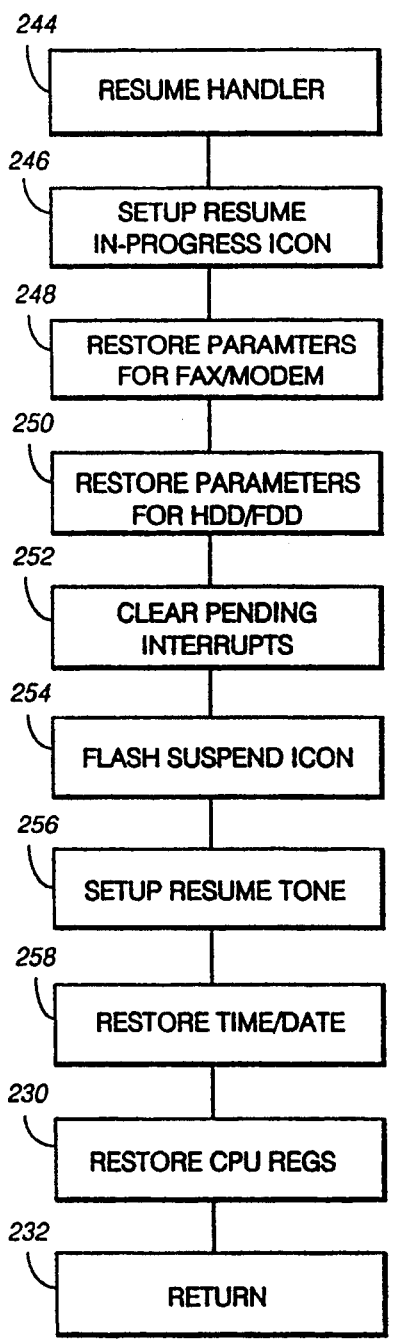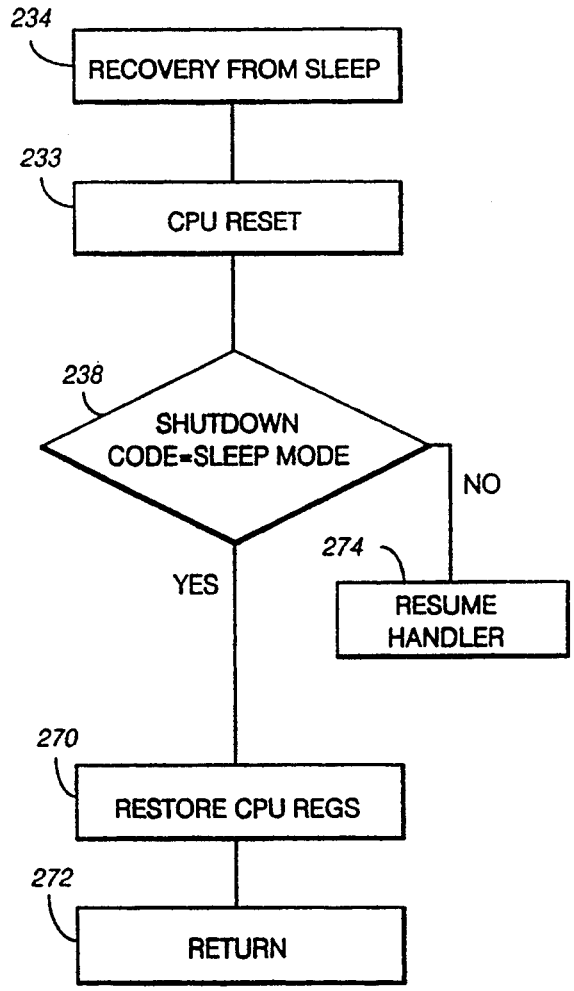

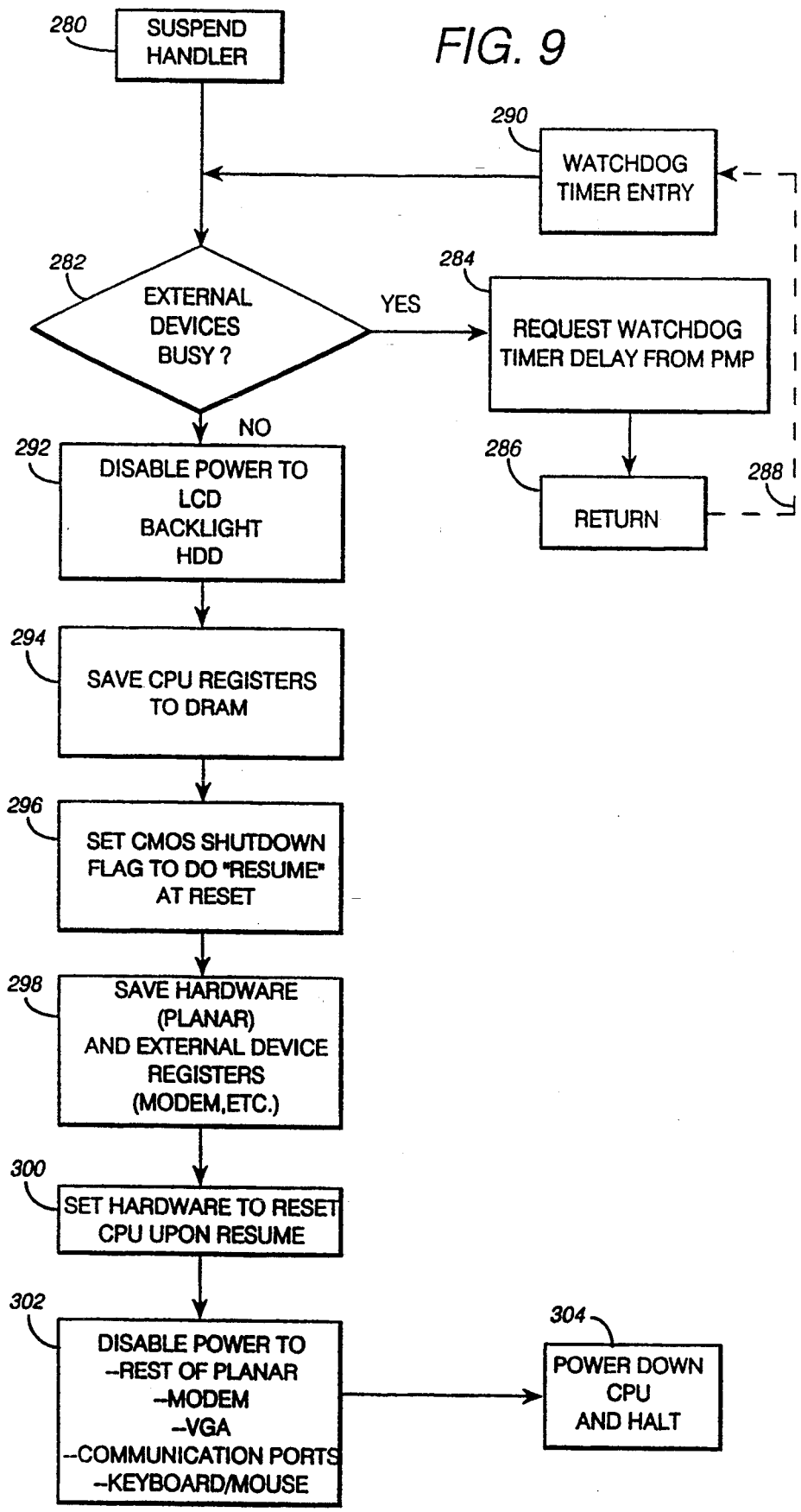

| CURRENT LOAD | FULL CHARGE (Vfc) | PARTIAL CHARGE (Vmc) | LOW CHARGE (Vlc) |
|---|---|---|---|
| 3.20 - 3.99 A | 10.81 V | 10.66 V | 9.83 V |
| 2.80 - 3.19 A | 10.86 V | 10.71 V | 9.83 V |
| 2.40 - 2.79 A | 10.96 V | 10.76 V | 9.83 V |
| 2.00 - 2.39 A | 11.00 V | 10.91 V | 9.83 V |
| 1.60 - 1.99 A | 11.10 V | 10.91 V | 9.83 V |
| 1.20 - 1.59 A | 11.15 V | 10.96 V | 9.83 V |
| 0.80 - 1.19 A | 11.25 V | 11.00 V | 9.83 V |
| 0.00 - 0.79 A | 11.30 V | 11.05 V | 9.83 V |

PREDETERMINED DISCHARGE ( 20 C )

FIG.10

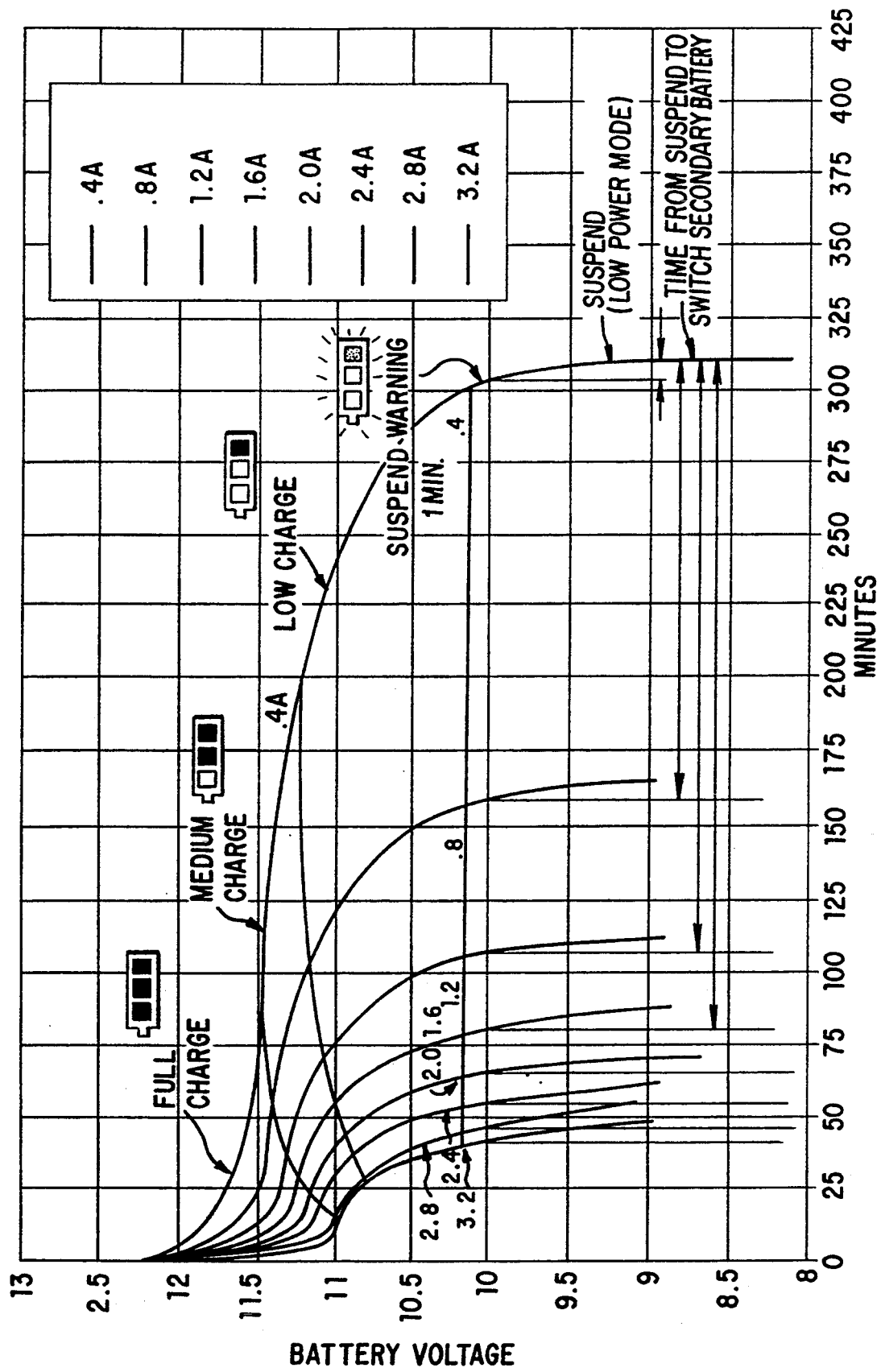

Thr Predetermined Discharge Table selected is based on the following criteria,

Table 1 -- Battery Temperature < 20
   Table 2 -- 20 <= Battery Temperature < 30
   Table 3 -- 30 <= Battery Temperature.

The number of Fuel Indicators displayed is calculated as follows,

3 Indicators (Panels) -- V   >= Vfc
   2 Indicators (Panels) -- Vfc > V   >= Vmc
   1 Indicator  (Panels) -- Vmc > V   >= Vlc
   3 Indicators Blinking -- Vlc > V
   0 Indicators          -- Vlc > V  for 1 min. Suspended The system is in a Full Charged State when the voltage is greater than or equal to Vfc in the temperature table for the given current load. Three Fuel Indicators are Displayed.

The system is in a Meduim Charged State when the voltage is less than Vfc and greater than or equal to Vmc in the temperature table for the given current load. Two Fuel Indicators are Displayed.

The system is in a Low Charge State when the voltage is less then Vpc and greater than or equal to Vlc in the Temperature table for the given current load.

FIG. 14

BATTERY CHARGE MONITOR FOR A PERSONAL COMPUTER

FIELD OF THE INVENTION

This invention relates to the field of battery charge monitors and, more particularly, to battery charge monitors for battery operated portable computers.

RELATED APPLICATIONS

The following applications filed concurrently herewith are directed to inventions only generally described herein:

(1) BATTERY OPERATED COMPUTER POWER MANAGEMENT SYSTEM by Francis James Canova, Jr. et al Ser. No. 07/647,118, filed Jan. 25, 1991.

(2) BATTERY OPERATED COMPUTER OPERATION SUSPENSION IN RESPONSE TO ENVIRONMENTAL SENSOR INPUTS, by Neil Alan Katz et al Ser. No. 07/646,304, filed Jan. 25, 1991.

(3) AUTOMATIC DEVICE CONFIGURATION FOR DOCKABLE PORTABLE COMPUTERS, by Francis James Canova, Jr. et al Ser. No. 07,646,138, filed Jan. 25, 1991.

BACKGROUND OF THE INVENTION

High performance portable computers commonly include a primary or main battery for operating the computer when it is not plugged into an ac power supply. The type of battery selected is dependent upon size, weight, and power requirements and is preferably rechargeable. While there are many battery operated computers available in different sizes ranging from desktop models, to laptops, handheld, and pocket models, the invention is designed for use primarily in high performance systems such as is currently available in many commercially available laptop models. Generally, most such computers have very simplistic battery charge monitors. Many provide only low battery warning signals allowing the user to save any volatile data on a disk, before the computer is shut off.

DESCRIPTION OF THE PRIOR ART

A typical prior art battery charge monitor is that contained within the model PC-G200 notebook computer manufactured by Sharp Corporation. The battery monitor for the PC-G200 includes three visual indicators (power, low battery and charge) and an audio indicator. When the battery becomes ninety percent discharged, the battery charge indicator turns red and the audio indicator beeps for a short time period. Other battery capacity or charge monitors are known which require the user to "call-up" a bar graph on an LCD of the portable computer. The graph displays the charge remaining within the battery.

SUMMARY OF THE INVENTION

The principal object of the present invention is to provide a battery capacity or charge monitor for a portable computer using a processor to monitor battery energy in such a manner as to allow the computer user to observe visual indications of particular charge or energy states of the battery.

Another object of the invention is to allow a portable computer user to obtain efficiently from the monitor reasonably detailed information regarding the remaining life of the battery.

Briefly, in accordance with the invention, a computer has a processor which monitors battery conditions and generates electrical signals for causing visual and audio indications of such conditions. Such processor also controls charging of the battery.

BRIEF DESCRIPTION OF THE DRAWINGS

Other objects and advantages of the invention will be apparent from the following description taken in connection with the accompanying drawings, wherein:

FIG. 7 is a flow chart of the resume handler operation;

FIG. 8 is a flow chart of the recovery-from-sleep operation;

FIG. 9 is a flow chart of the suspend operation;

FIG. 10 is a chart showing a predetermined discharge table for NiCad batteries operated at 20 degrees centigrade;

FIG. 11 is a graphical representation of the chart of FIG. 10 and of further explanatory information;

FIG. 14 is a chart showing the algorithms for selecting a predetermined discharge table and illuminating or highlighting the panels 137.

DETAILED DESCRIPTION OF THE PREFERRED EMBODIMENT

Figure 1:
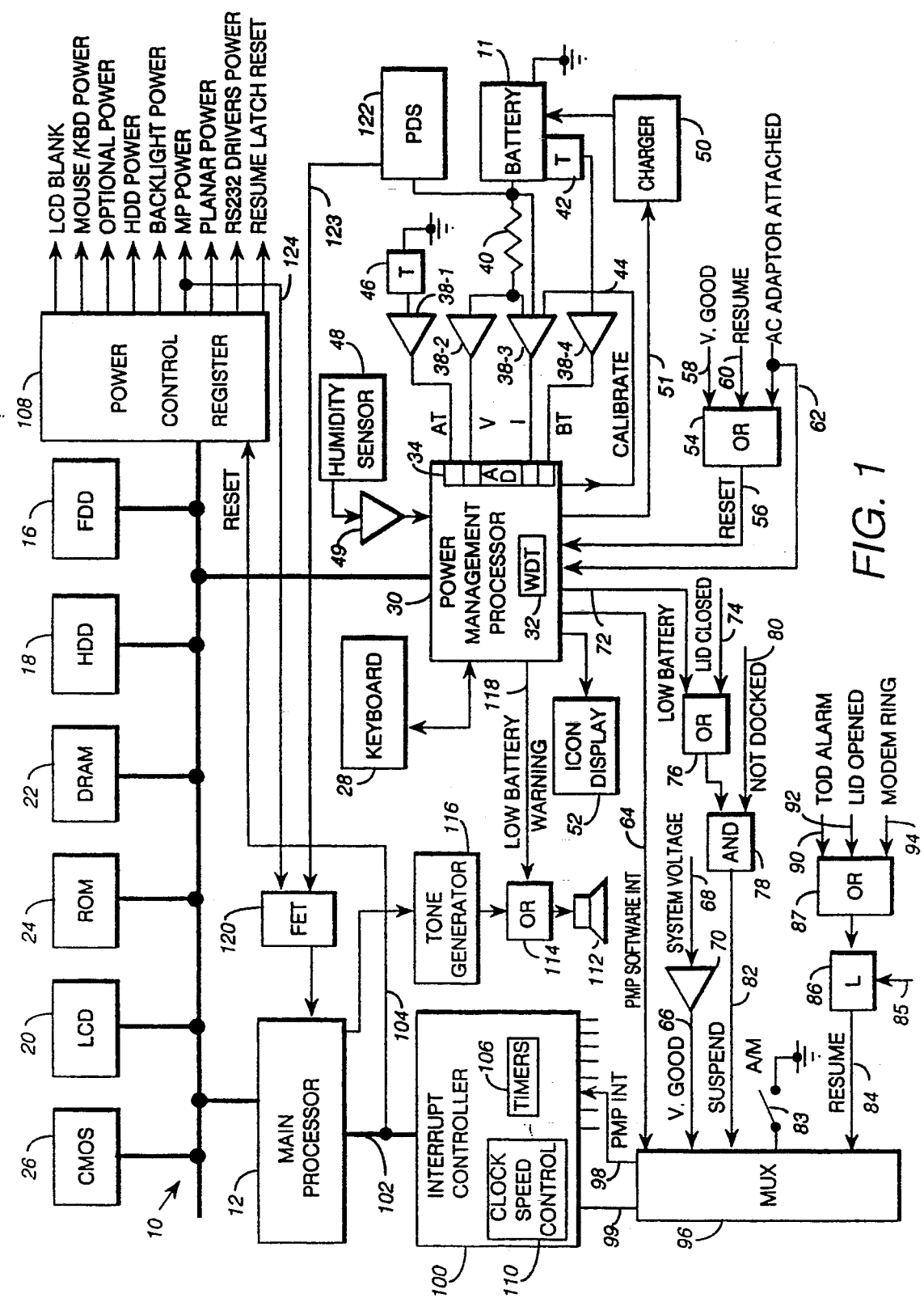
FIG. 1 is a block diagram of a battery operated computer embodying the invention.

Referring now to the drawings and first to FIG. 1, a computer 10 selectively operates with power from a battery 11 or from an AC power source. Computer 10 comprises a main processor 12 which is a high performance microprocessor such as an 80386SX microprocessor. Processor 12 is the main or primary processor in computer 10 for executing application programs under the control of an operating system such as IBM DOS or OS/2. Processor 12 is connected to a system bus 14 which in turn is connected to I/O devices such as a liquid crystal display (LCD) 20, a floppy disk drive (FDD) 16, and a hard disk drive (HDD) 18. Bus 14 is also connected to a dynamic random access memory (DRAM) 22, a read only memory (ROM) 24, and a battery backed, capacitive metal oxide semiconductor storage device referred to hereafter as CMOS 26. Such elements are conventional and are currently commercially available in portable computers such as laptop computers. Inasmuch as the invention is related to measuring, or controlling the battery power, only so much of the structure and operation of conventional elements as is necessary for an understanding of the invention will be described herein.

FDD 16 has its own controller and turns off power consumption when the drive is not being accessed. Power to HDD 18 is controlled by the power management functions of the PMP 30 and allows the user to set the length of a time delay for turning off power to the HDD when it has not been accessed for the length of the delay. Power is restored upon any subsequent access to such disk. LCD 20 uses two power inputs to separately control blanking of the LCD screen and control backlighting of the screen to improve visibility. DRAM 22 is the computer main memory and stores application and operating system programs for execution by main processor 12. ROM 24 stores the various interrupt handlers described in detail hereinafter. CMOS 26 stores information on user selections and control flags, as described in detail below.

Bus 14 is further connected to a power control register (PCR) 108, and a power management processor (PMP) 30. PMP 30 is preferably a Hitachi controller chip 330/H8 having its own RAM, ROM, 16-bit CPU, eight analog input pins, watchdog timer (WDT), and sixteen digital I/O pins for receiving and emitting various signals to and from the devices controlled and monitored by the PMP. PMP 30 is connected to a keyboard 28 and monitors the operation of the keyboard in addition to performing power management functions. When a key is actuated or pressed, PMP 30 monitors contact bounce and produces a key scan code when the contacts close and open, much in the same manner as has been done in prior art personal computers by microprocessors dedicated to monitoring keyboard functions. PMP 30 includes a watchdog timer (WDT) 32 used as described hereinafter. PMP 30 scans the various lines on a time sliced, round robin basis, services those that require it and quickly passes over those that don't. PMP 30 has four internal registers (not shown) shared between it and MP 12 for communicating therebetween.

PMP 30 monitors or measures the ambient temperature (AT), and the battery characteristics, namely, battery voltage (V), current (I) and temperature (BT), and uses this information to control battery charging and power consumption and to ascertain battery charge or energy status. Such measurements are made using four operational amplifiers 38 -1-4 which are respectively connected to a thermistor 46, to a resistor 40 connected to battery 11, across resistor 40, and to a thermistor 42 mounted in the casing of battery 11. In operation, the four amplifiers 38 -1-4 output four electrical signals which respectively represent the ambient temperature and the three battery characteristics. The amplifiers 38 are each connected to a different analog input 34 of PMP 30. A line 44 is connected between PMP 30 and the amplifier 38-3 to allow a signal of predetermined value to be transmitted to such amplifier and calibrate measurements therefrom. PMP 30 is also connected to a humidity sensor 48 and a comparator 49 that produces a digital input indicating when the ambient humidity within computer 10 is above or below a preset value around 93% When the humidity is above such preset value, the computer 10 is prevented from powering up if it is turned off or from resuming if it is suspended. Further details of monitoring such environmental conditions are described and claimed in the above-mentioned related application (2).

Battery 11 is charged when the computer is powered by an ac power source. Such charging occurs when the battery energy is below a fully charged level, and continues until the battery becomes fully charged. When the battery energy level is below the fully charged level, as determined or ascertained by PMP 30, PMP 30 transmits a signal on line 51 to turn on a charger 50. The charger controls the rate at which the battery is charged. When the battery becomes fully charged, as determined or ascertained by PMP 30, PMP 30 then transmits a signal on line 51 to turn off charger 50.

Desirably PMP 30 is programmed to transmit a signal on line 51 to turn off the charger 50 when any one of the following conditions is met:

(I) the battery 11 becomes fully charged, or (II) the charger 50 has been operating ten continuous hours, or (III) the internal battery temperature has risen ten degrees centigrade since the start of battery charging, or (IV) the battery temperature BT is below five degrees centigrade or above 47 degrees centigrade, or (V) the ambient air temperature AT is below five degrees centigrade or above 45 degrees centigrade.

The internal battery temperature (IBT) equals battery temperature minus ambient air temperature. In other words, IBT=BT−AT.

An or gate 54 is used to reset the PMP 30 under three conditions: when the system voltage becomes "good" such as when a charged battery is installed, in response to a resume signal, and when the ac adaptor is attached. Such conditions are fed as signals V. GOOD, RESUME, AND AC ADAPTOR ATTACHED on lines 58, 60, and 62. When the lid is closed, the system is suspended and most power is off. Since PMP 30 is used to control the charger, PMP 30 needs its own power to allow the battery to be recharged while the lid is closed. PMP 30 is thus reset when the ac adaptor is connected to a power source and to the computer. A line 62 indicates when the adaptor is attached.

Figure 2:
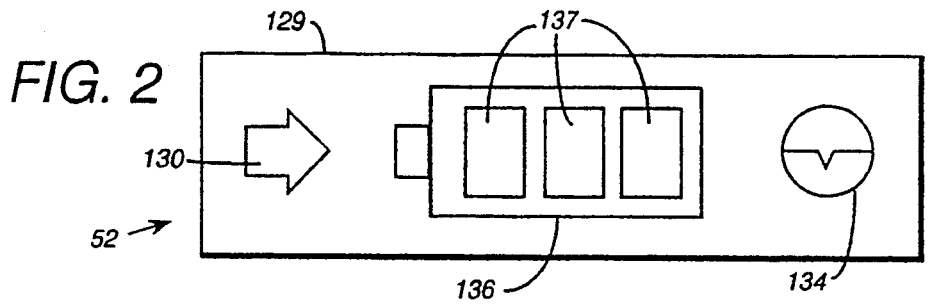
FIG. 2 is a plan view of the icon display shown in FIG. 1.

PMP 30 controls an icon display 52 which produces three icons 130, 136, 134 shown in FIG. 2. The icons are formed in a panel 129 mounted on the computer housing in a place conspicuous to the user. A charging icon 130 is highlighted when the battery 11 is being charged. This icon is in the form of an arrow pointing into the battery. A battery-shaped fuel icon 136 contains three panels 137. When the battery 11 has a full charge (Vfc), all three panels are highlighted. As power is consumed, the panels 137 are consecutively turned off to indicate ⅔ full (medium charge Vmc), ⅓ full (low charge Vlc). When the remaining battery energy is too low, (i.e., less than a low charge), the remaining highlighted panel is flashed for a short period (i.e., one minute) and then all of the panels are turned off indicating an empty battery. Alternatively, the PMP 30 can be programmed such that, when the remaining battery energy is too low, all three panels and the entire icon 136 is flashed indicating an empty battery. A suspend icon 134 has a standard shape for such function and is highlighted when the computer 10 is in a suspended mode. Such icon is flashed during resume operations and is shut off after the completion of resume when the system becomes active. In accordance with a preferred display scheme the predetermined discharge table selected is based on the following criteria:

| Table 1 | Battery temperature < 20 |
|---|---|
| Table 2 | 20 <= Battery temperature < 30 |

-continued

| Table 3 | 30 <= Battery temperature |

The number of fuel indicator panels displayed is calculated as follows:

| 3 panels | V > Vfc |
| 2 panels | Vfc > V >= Vmc |
| 1 panel | Vmc > V >= Vlc |
| 3 panels blinking | Vlc > V |
| 0 panels | Vlc > V for 1 minute. Suspended. |

The system is in a Full Charged State when the voltage is greater than or equal to Vfc in the temperature table for the given current load. Three fuel indicators or panels are displayed. The system is in a Medium Charged State when the voltage V is less than Vfc and greater than or equal to Vmc in the temperature table for the given current load. Two fuel indicators are displayed. The system is in a Low Charged State when the voltage V is less than Vmc and greater than or equal to Vlc in the temperature table for the given current load. When the voltage V is less than Vlc, the system is in a fully discharged state.

The PMP 30 controls the highlighting of the icons 130, 134, 136 according to instructions and data which are stored in the ROM 24. For controlling the panels 137, the PMP 30 suitably samples the electrical signals present on the outputs of the amplifiers 38-2, 3, 4. Such signals contain information related to the voltage V, current I and temperature BT characteristics of the battery 11. Dependent upon the battery temperature BT, the PMP 30 selects a particular discharge table from a plurality of discharge tables stored, for example, in the ROM 24. A preferred scheme for selecting a discharge table (e.g., table 2 of FIG. 10) is set forth in FIG. 14. Once the correct table is selected, the PMP 30 uses the current signal I to determine the appropriate load curve and then uses the voltage signal V to determine an intersection point with the appropriate load curve. At such intersection, the charge zone for the battery can then be ascertained. See FIG. 11. The curves of FIGS. 11, 12A–C, and 13 are obtained empirically.

PMP 30 outputs a LOW BATTERY signal on line 72 when battery 11 becomes discharged and provides an alarm signal on line 118. Line 72 is connected to an or gate 76 which also receives a LID CLOSED signal on input line 74. An and gate 78 receives the output of or gate 76 along with a NOT DOCKED signal on line 80. Computer 10 can also be connected to a docking station (not shown) which is an expansion unit allowing AT cards to be attached to the system, and a NOT DOCKED signal is generated by gate 78 in response to the low battery signal when the computer 10 is not connected to the docking station. The output of gate 78 is a SUSPEND signal that is fed by line 82 into a MUX 96 and controls when the system is suspended. In summary, the system is suspended when the system is not docked and either the lid is closed and/or the battery is discharged. Further details concerned with the docking station are contained in related application (3).

MUX 96 has a plurality of inputs which are monitored or polled by the MUX for any active inputs. In response to detecting an active input on any line, MUX produces an interrupt request signal PMP INT on output line 98 along with coded signals on line 99 representing or identifying the particular input line having the active signal. Lines 98 and 99 are connected to a controller 100. Controller 100 is a Western Digital 76C10, which includes timers 106 to control backlighting of LCD 20. Timers 106 are reset when keyboard or mouse activity occurs on display 20. The timers count up to a preset value which, when reached, shuts off the display while leaving the backlight on. Controller 100 is connected by lines 102 to processor 12 for interrupting the processor in accordance with its architecture and executing a power management interrupt handler in accordance with the particular type of interrupt. Controller also outputs a signal on line 104 for resetting the power control register when the power comes on after a resume operation.

Figure 3:
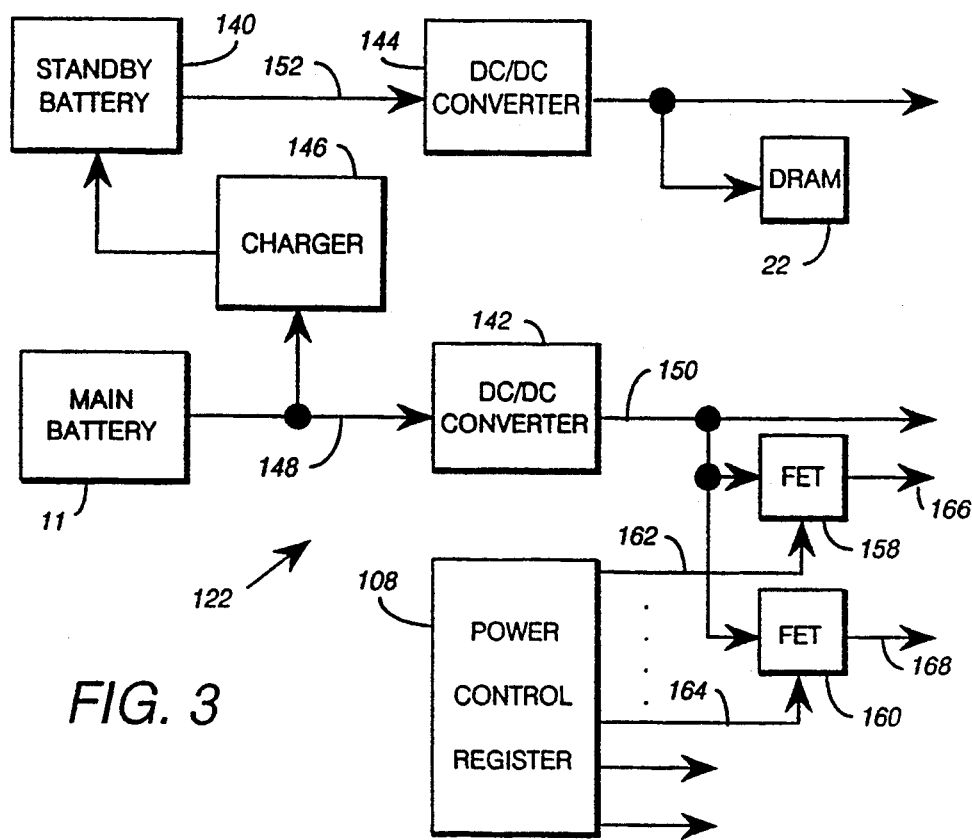
FIG. 3 is a block diagram illustrating the power distribution system shown in FIG. 1.

Line 64 is connected between PMP 30 and MUX 96 and receives an active PMP SOFTWARE INT signal when the software executing in PMP 30 initiates an interrupt. This will happen under the watchdog timeout, beyond temperature, and low battery conditions described with reference to FIG. 4. A comparator 70 is connected to an input line 66 of MUX 96 and has an input line 68 receiving a signal indicating the system voltage. Such input is compared against a preset internal value in comparator 70 and when the input is at the normal level of five volts, an V. GOOD signal is generated to thereby initiate a power management interrupt. System voltage is the voltage at the output of the regulated converter 142 (FIG. 3). Such V. GOOD signal becomes active when battery 11 is replaced with a charged battery and when ac power is turned on.

Another MUX input line 84 is connected to a latch 86 that receives an input from the output of an or gate 87 having three inputs 90, 92 and 94 for respectively receiving a time of day alarm signal TOD ALARM, a LID OPENED signal, and a MODEM RING signal. The output of latch 86 is a RESUME signal for switching the computer from the suspended mode to the active mode. This occurs when the lid is opened, when a modem (not shown) is ringing and when a certain time of day has been reached. These last two signals allow the computer to be operated even though the lid is closed giving the user the opportunity to receive modem signals, such as those connected with a FAX operation, or to accomplish a task at a certain time of day, e.g., emit an alarm signal like an alarm clock. Another MUX input is connected to automatic/manual switch A/M 83 so that a power management interrupt is generated when the switch position is changed.

Under battery power, computer 10 operates in two different modes, active and suspend. When active, processor 12 runs at a preselected speed dependent on the setting of switch 83 and the user selection of a manual speed. An application can also shut off power to the processor 12 by turning off its Vcc input, as described below. Processor 12 is connected to a clock speed control 110, which is part of controller 100 and produces three predetermined clock rates of 5, 10 and 20 MHz. When the computer is running under battery power or ac power, the processor is run at a 20 MHz rate or at a rate preselected. When operating under battery power, processor 12 is run at 5, 10 or 20 MHz dependent on the setting of a switch 83 settable to a manual or an automatic position. When set to the manual position, processor 12 operates at a rate preselected by the user. When the switch is set to the automatic position, processor 12 is run in accordance with two options for energy management one of which is preselected by the user, a "high performance" option or a "long battery life" option. The processor speed is automatically managed in accordance with which option is selected. When in the active mode, the various devices including the keyboard, are monitored for activity and if there is no activity after a preset timeout period, the processor is switched to the "sleep" condition in which the processor is turned off via its Vcc input. Such condition is transparent to the user, and the display is not affected.

An or gate 114 operates speaker 112 with tones from the tone generator 116 or line 118. Tones are changed when the system goes from a full to ⅔, and ⅔ to ⅓, and about 3 minutes before the system suspends. Different Tones are created when the system suspends and resumes, and for keyboard key clicking. Tone generator 116 is controlled by processor 12 executing interrupt routines.

The actual turning on and off of the power to individual devices is controlled by the setting of PCR 108 which is turn is controlled by processor 12 executing the interrupt handling routines. Processor 12 controls the settings of register 108 to provide output signals for controlling power to LCD blanking, mouse keyboard power, optional power, HDD power, backlight power, main processor, planar power, and RS232 drivers power. Register 108 also provides a signal for resetting latch 86 by reset line 85.

Battery 11 is preferably a rechargeable nickel-cadmium (NiCad) battery chosen because of the high watt hours per unit weight and watt hours per unit size ratios. Such technology has proven successful for the past several years, and provides to the user a relatively cheap, readily available replacement. As will be obvious to those skilled in the art, some of the power management techniques used herein are generic to both rechargeable and non-rechargeable batteries. Other techniques are generic to rechargeable batteries. Others such as the particular algorithms to run the fuel gage and determine the battery energy or fuel level as a function of BT, V and I, are limited to NiCad batteries. The difficulty with NiCAd batteries is that the relationship between the remaining energy is not linear with e.g. voltage. Also the charging control might be different for other types of batteries.

Current battery operated computers sometimes have a low battery indicator which when activated provides the user with a signal that is rather indefinite as to how much time remains. In computer 10, the battery is preferably used until it becomes fully discharged whereupon operation is suspended. The user can then remove the discharged battery and replace it with a fully charged one or plug in the ac adaptor. Such operation has the added advantage of fully discharging a battery to thereby avoid battery memory effects.

Battery 11 is also connected to a power distribution system (PDS) 122, the details of which are generally shown in FIG. 3. Battery 11 is connected by line 146 to a regulated DC/DC converter 142 which converts the battery voltage, which varies in the range 12 to 9 volts, into a system voltage of 5 volts. System voltage is regulated within close tolerances, e.g., 2%. Line 150 is connected to the output of converter 142 and to a plurality of field effect transistors (FET) which supply the power to the various devices. The output lines of power control register 108 are respectively connected to the control inputs of the FETs so they are turned on and off dependent on the setting of the control register. As illustrated in FIG. 2, line 150 is connected to FET 158 and 160 whose output lines 166 and 168 supply power to, e.g., HDD 18 and LCD 20. As shown in FIG. 1, a power line 123 is connected to FET 120, and line 124 is connected between FET 120 and the output line for the MP POWER signal. The output of FET 120 is fed to the Vcc input of processor 12 and is used to turn the processor off when an application calls a BIOS wait loop.

A standby battery 140 is connected by line 152 to a second DC/DC converter 144. Battery 140 supplies a lower voltage (3.3 volts) that is stepped up by converter 144 to the system voltage level and is used to power DRAM 22 when the main battery has been removed for replacement. A charger 146 is connected to line 148 to charge battery 140 from battery 11 so long as 11 has a charge.

Figure 4:
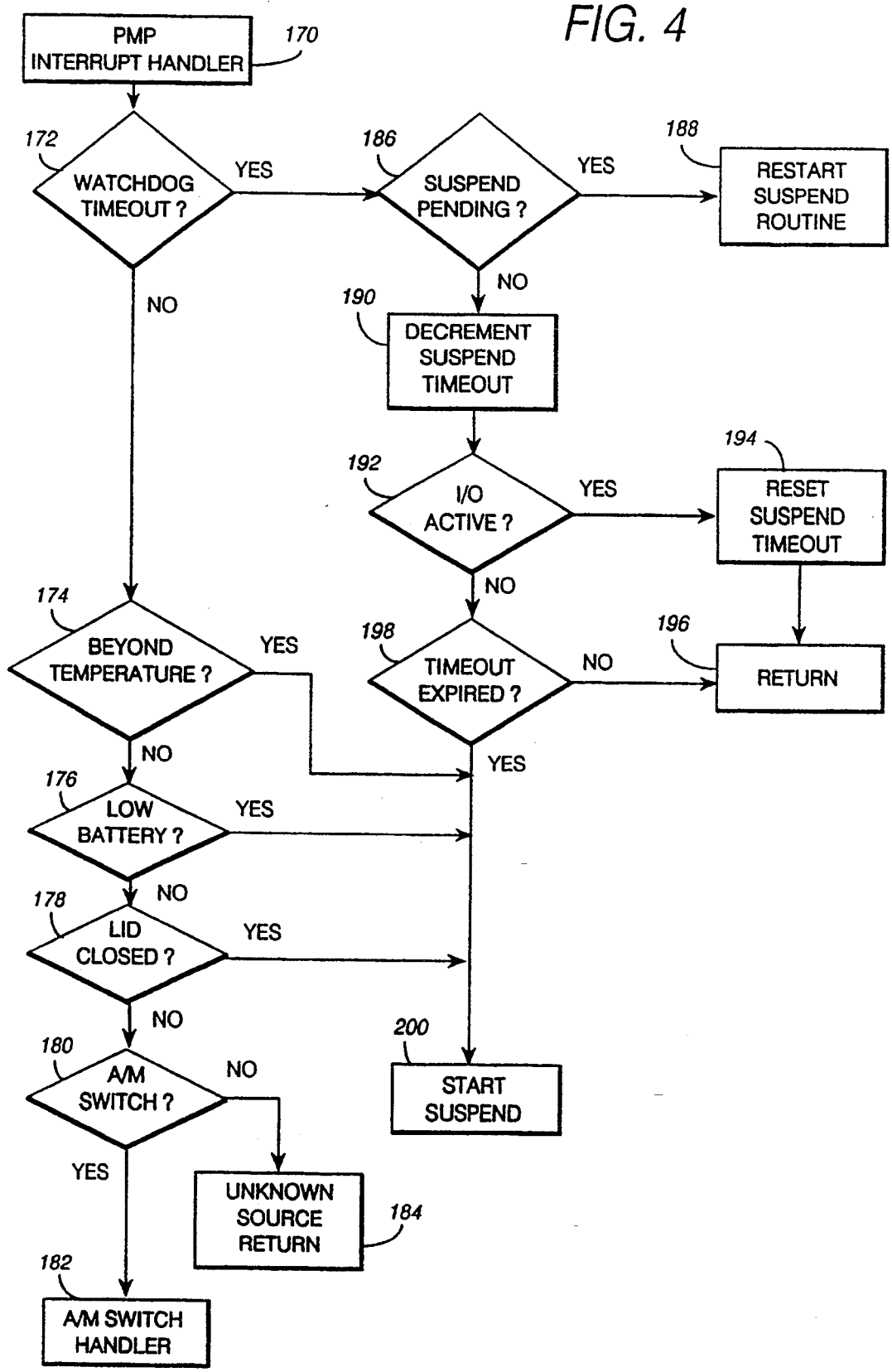
FIG. 4 is a flow chart of the PMP software interrupt handler operation.

Rom 24 stores a basic input/output operating system (BIOS) which includes various power management interrupt handlers and routines for processing PMP interrupts and accomplishing certain power management functions that will now be described. Referring to FIG. 4, PMP interrupt handler 170 makes a series of decisions as to the type of interrupt and then performs operations dependent on such decisions. Steps 172–180 respectively determine if the interrupt is a watchdog timeout interrupt, a interrupt caused by the ambient temperature being beyond or out of range, a low battery interrupt, a lid closed interrupt, or an A/M switch interrupt. If the decisions in steps 172–178 are negative, and step 180 makes a positive determination, step 182 branches to the A/M switch handler 202 shown in FIG. 5. If step 180 results in a negative determination, then step 184 treats the interrupt as coming from an unknown source e.g., spurious line noise) and returns.

If step 172 concludes the interrupt is from the watchdog timer, step 186 determines if there is a pending suspend, i.e., the suspend operation has already begun but was delayed and has not completed. If so, step 188 restarts the suspend routine. If not, step 190 decrements the suspend timeout. Next, step 192 determines if any I/O device is active. If so, step 194 resets the suspend timeout. If not, step 198 determines if such timeout has expired. If not, step 196 returns to the application in progress. If so, then step 200 starts the suspend routine. Positive determinations from steps 174-178 also branch to step 200 to start the suspend routine.

Figure 5:
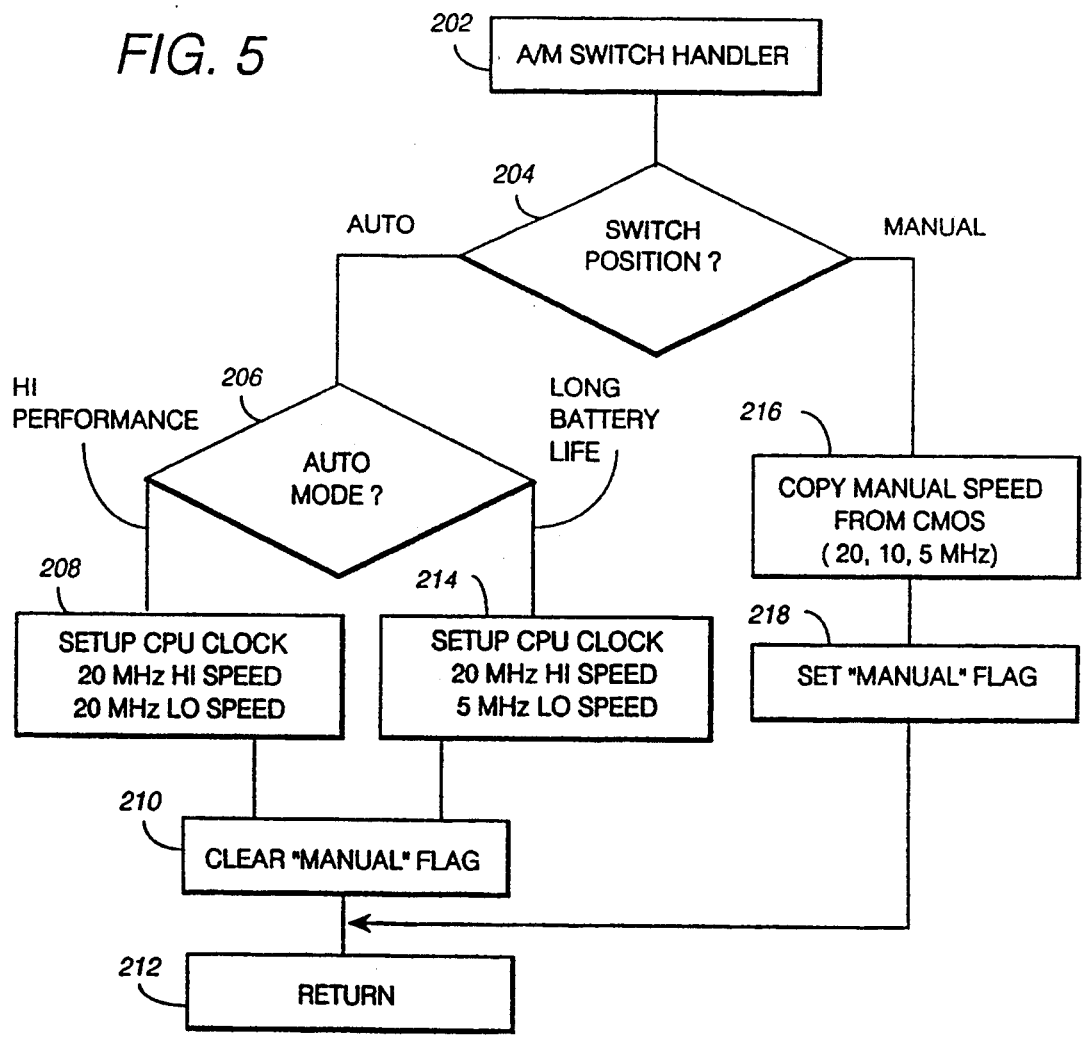
FIG. 5 is a flow chart of the A/M switch handler operation.

At the start of the A/M switch handler 202 shown in FIG. 5, step 104 branches to either steps 206 or 216 dependent upon the position of switch 83. If the switch is set to the automatic position, step 206 decides if the user has selected the system to be run to provide high performance or a long battery life. For high performance, step 208 sets up the cpu clock, through clock speed control 110, so that both high and low speed operations are both at 20 Mhz. For long battery life, step 214 sets the clock to run at 20 MHz for high speed and at 5 MHz for low speed. Step 210 thereupon clears the "manual" flag setting in the CMOS and step 212 returns to the application. If the switch is set to the manual position, step 216 copies from CMOS the manual speed which the user has preselected so that the clock is set at 5, 10, or 20 MHZ for manual speed. Step 218 then sets the "manual" flag in the CMOS and step 212 then returns.

Figure 6:
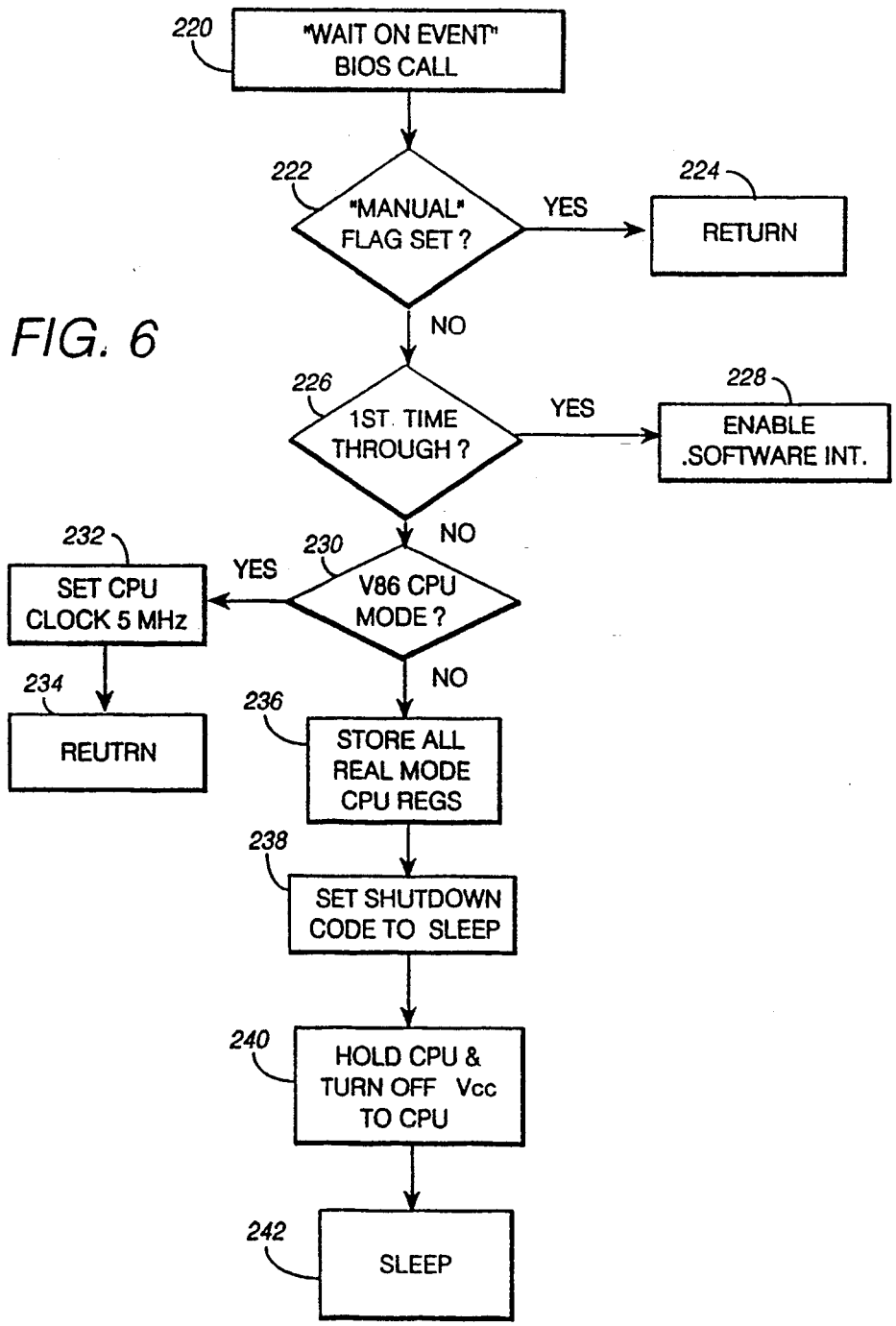
FIG. 6 is a flow chart of the "wait on event" operation.
Figure 12A:
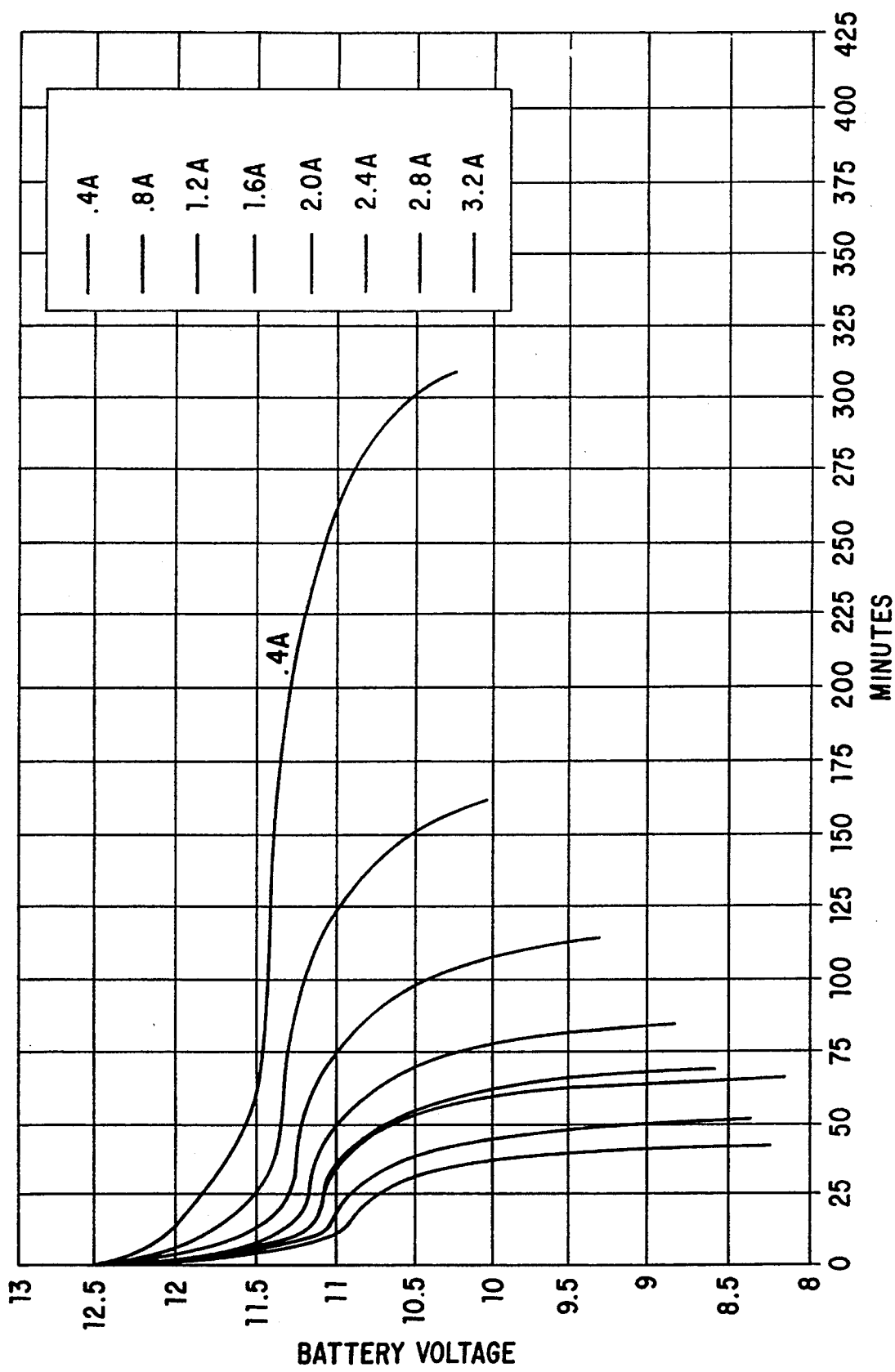
FIGS. 12A, 12B and 12C are graphs of discharge curves for NiCad batteries at different temperatures.
Figure 12B:
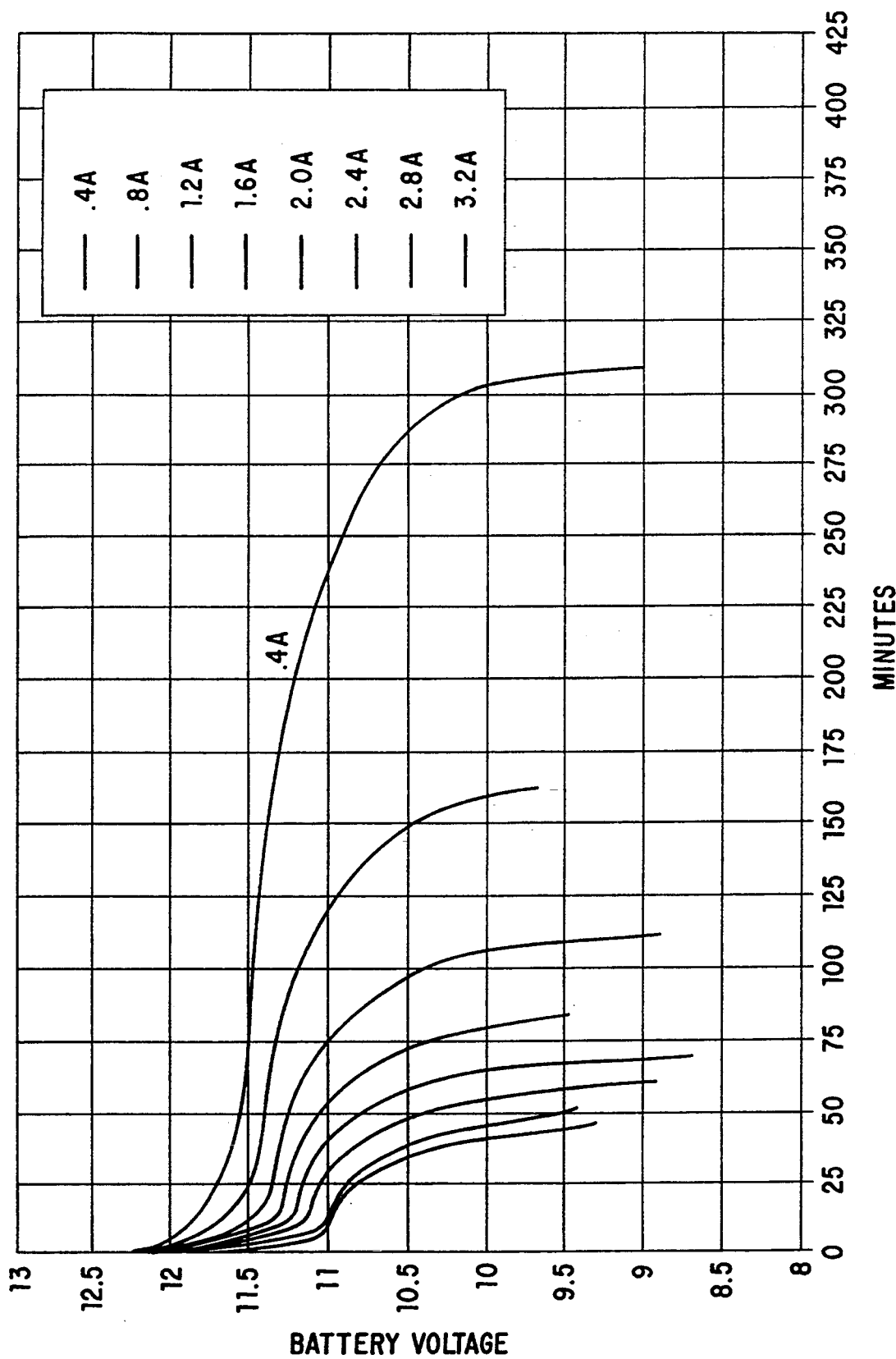
Figure 12C:
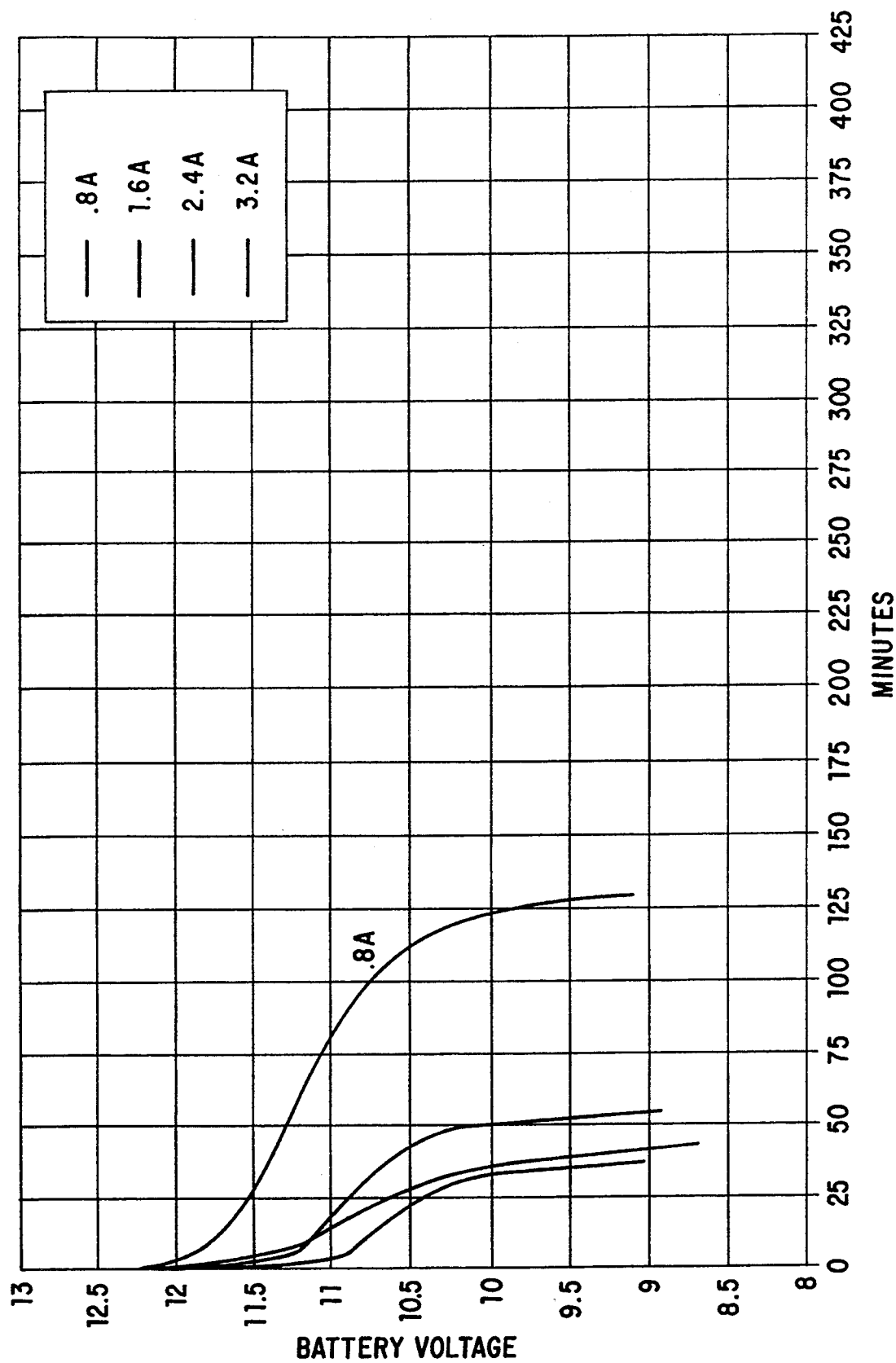
Figure 13:
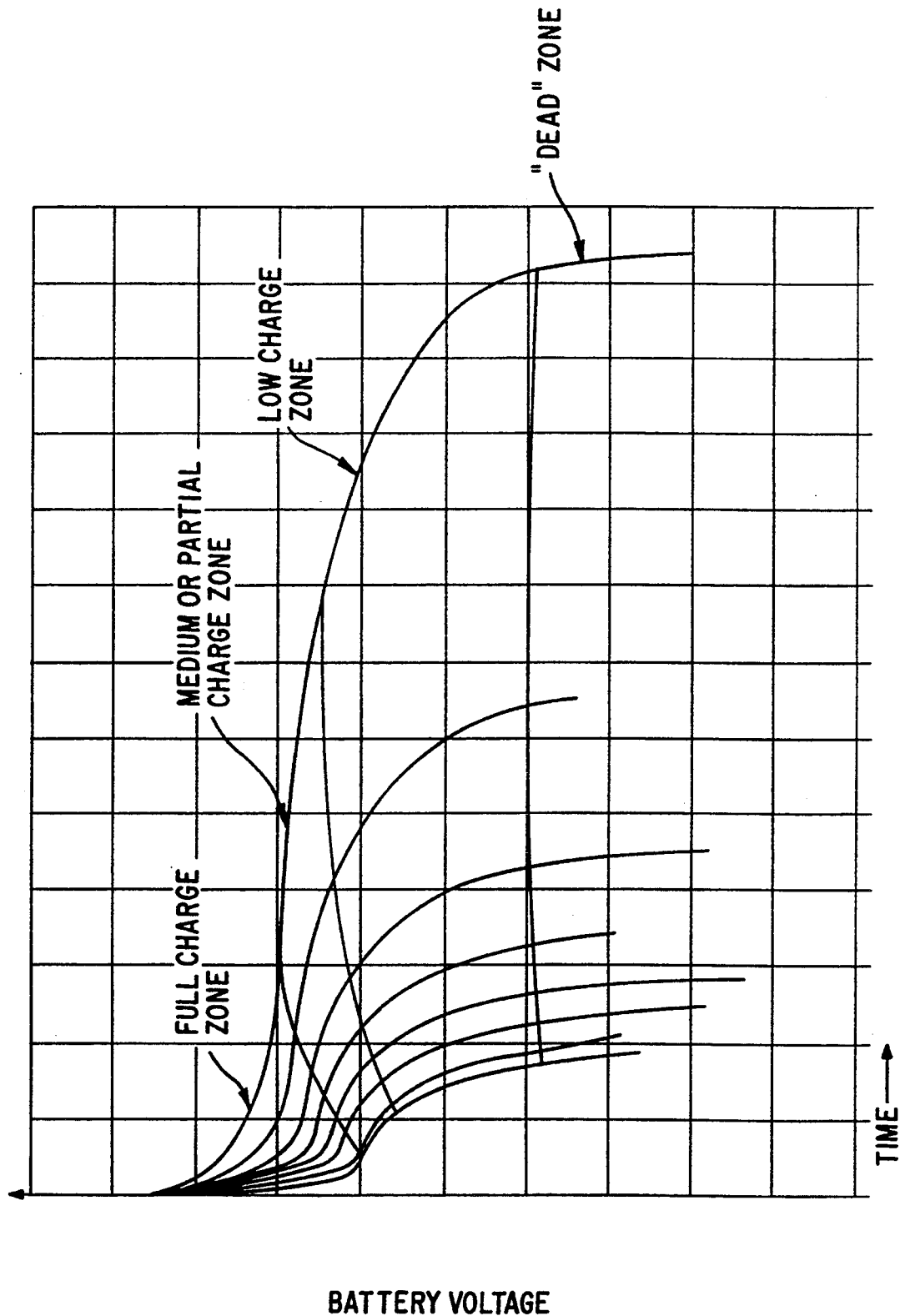
FIG. 13 is a generic discharge table at one temperature showing a plurality of charge zones for identically rated batteries under different loads.

Referring to FIG. 6, routine 220 is invoked when a wait on event call is made to BIOS by an application program. This routine allows the user the opportunity to conserve battery drainage by shutting off processor 12 and placing is in a sleep condition. Step 222 decides if the "manual" flag has been set. If so, step 224 returns. If not, step 226 determines if the current operation is the first time though routine 202 and if so, branches to step 228 to enable PMP interrupts. Step 230 decides if the computer has a V86 mode of operation. If so, step 232 sets the cpu clock to run at 5 MHz and step 234 returns. If not, step 236 stores all of the real mode CPU registers in processor 12. Then step 238 sets the shutdown code to indicate a sleep condition. Step 240 then holds the CPU and turns off the power to Vcc to effectively provide a 0 MHz speed causing (step 242) processor 12 to be in a sleep condition.

Resume handler 244 (FIG. 7) first flashes (step 246) the suspend icon to indicate that the resume operation is in progress. Next, step 248 restores the parameter settings for any FAX and modems (not shown) present in computer 10. Step 250 then restores the parameter setting for HDD 18 and FDD 16. Step 252 clears any pending interrupts. Steps 254 and 256 respectively turn off the suspend icon to indicate resume has been completed and setup the tone generator to emit a distinctive sound indicating the end of the resume operation. Step 258 then restores the time and date stored in DRAM 22, step 260 restores all cpu registers, and step 262 returns to the application.

When the processor 12 is in a sleep condition, power to processor 12 is turned off. Recovery from sleep routine 264 (FIG. 8) is invoked by a keyboard interrupt which first sets PCR 108 to activate the MP POWER signal and restore power to the processor. Routine 264 first resets the cpu in step 266. Step 268 analyzes the shutdown code. If the code is not set to indicate sleep mode, step 274 branches to the resume handler. If the shutdown code indicates sleep mode, step 270 then restores the cpu registers and step 272 returns.

Referring to FIG. 9, suspend handler 280 is executed in response to the SUSPEND signal and generally performs the task of shutting down all power to the system except for CMOS 26, which has its own backup battery for retaining information stored therein, when the computer has been shut off, and except for DRAM 22. When handler 280 is executed, the following operations occur. First, step 282 decides if any external devices are busy. If none is, then step 292 disables power to LCD 20, to the backlight for the LCD, and to HDD 18. The contents of the cpu registers in main processor 12 are then saved by storing them in DRAM 22 by step 294. A shutdown flag in CMOS 26 is then set by step 296 to direct a Resume operation when the computer is subsequently reset. Next, step 298 saves the contents of registers in the planar and in external devices such as modem, optional devices, etc. Step 300 the sets the hardware to reset the cpu upon commencing a subsequent Resume operation. Step 302 then disables power to the rest of the planar devices, the modem, VGA, communication ports, and keyboard/mouse by setting the control bits stored in PCR 108 accordingly. Step 304 then powers down the cpu and sets it to a halt state. If in step 282 a determination is made that one or more external devices are still busy, step 284 then requests a watchdog timer delay from PMP 30, and a return to application is made by step 286. This action has the effect schematically indicated by line 288 of causing a time delay to wait for any busy device to become idle. Afterwards, a repeat of step 282 results in a negative determination on busy devices and the negative branch operations beginning with step 292 are performed as described above.

It should be apparent to those skilled in the art that many changes can be made in the details and arrangements of steps and parts without departing from the scope of the invention as defined in the appended claims. For example, only a main processor such as processor 12 need be used to realize the benefits of the invention. Processor 12 can be provided with suitable A/D convertor and additional elements so as to function like the processor 30.

What is claimed is:

1. In a battery operated portable computer comprising a rechargeable nickel cadmium battery for powering said computer; a power distribution system connected to said battery for distributing power from said battery to components of said computer; first memory means for storing programs; a plurality of input/output devices for inputting and outputting information into and from said computer; and a main processor connected to said first memory means for executing said programs, said main processor being connected to said input/output devices and to said power distribution system for controlling operation thereof; the improvement comprising:

monitoring means connected to said battery for monitoring battery voltage, battery current, and battery temperature and generating output signals V, I, and BT indicative thereof;

second memory means for storing a plurality of discharge tables of empirical data defining non-linear discharge characteristics of said nickel cadmium battery, said tables defining battery voltages versus discharge times for a plurality of different discharge currents and a plurality of different battery temperatures, each table being for a different battery temperature and divided into a plurality of charge zones representing different level of charge of said battery, said charge zones including a fully charged battery zone, at least one partially discharged zone, and a fully discharged zone;

a charge indicator mounted on said computer in a position conspicuous for continuous viewing by a user and having a plurality of selectively highlightable panels corresponding in number to one less than said plurality of charge zones;

and power management means connected to said monitoring means and to said charge indicator for selectively highlighting said panels in accordance with present charge status of said battery, said power management means comprising a power management processor programmed to periodically sample said outputs V, I, and BT from said monitor, access a predetermined one of said tables in accordance with said BT, select a discharge current curve from said predetermined one of said tables, in accordance with said I, determine a present charge zone from the discharge current curve selected in the preceding step in accordance with said V, and selectively illuminate said panels in accordance with said present charge zone.

2. A computer in accordance with claim 1 wherein said power management processor is operative to selectively illuminate said panels by:

highlighting all of said panels when said present charge zone is said fully charged zone;

highlighting at least one less than all of said panels when said present zone is said partially charged zone;

and blinking at least one of said panels for a predetermined period of time when said present zone is said fully discharged zone and after lapse of said period turning off all of said panels.

3. A computer in accordance with claim 2 comprising:

a selectively operated tone generator for generating different tone signals;

a speaker connected to said tone generator and operative to produce an audio signal in accordance with one of said tone signals;

and audio control means connected to said power management power management processor and said tone generator for operating said speaker to emit a predetermined tone audio signal in response to a transition in said present zone between said charge zones.

4. A computer in accordance with claim 3 wherein: said audio control means comprises an interrupt routine executable by said main processor, said main processor being connected to said power management processor for receiving interrupt signals therefrom in response to a transition between charge zones.

5. A computer in accordance with claim 4 comprising:

switching means responsive to detecting when said battery has become fully discharged to switch said computer into a suspended state allowing replacement of said battery with a charged second battery, said switching means being further operative in response to said second battery being connected into said computer to resume data processing operation of said computer with power from said second battery, such data processing operation being resumed at a point that occurred immediately before said computer was switched to said suspended state;

said power management processor being operative to operate said charge indicator to indicate the charge of said second battery.

* * * * *